United States Patent
Ernst et al.

(10) Patent No.: US 7,518,195 B2
(45) Date of Patent: Apr. 14, 2009

(54) FIELD-EFFECT MICROELECTRONIC DEVICE, CAPABLE OF FORMING ONE OR SEVERAL TRANSISTOR CHANNELS

(75) Inventors: Thomas Ernst, Charnecles (FR); Stephan Borel, Saint Martin d'heres (FR)

(73) Assignee: Commissariat a l'Energie Atomique, Paris (FR)

( * ) Notice: Subject to any disclaimer, the term of this patent is extended or adjusted under 35 U.S.C. 154(b) by 44 days.

(21) Appl. No.: 10/576,145

(22) PCT Filed: Oct. 21, 2004

(86) PCT No.: PCT/FR2004/050524

§ 371 (c)(1), (2), (4) Date: Apr. 18, 2006

(87) PCT Pub. No.: WO2005/041309

PCT Pub. Date: May 6, 2005

(65) Prior Publication Data

US 2007/0126035 A1 Jun. 7, 2007

(30) Foreign Application Priority Data

Oct. 22, 2003 (FR) .................................. 03 50716

(51) Int. Cl.
  *H01L 27/088* (2006.01)

(52) U.S. Cl. ...................................... 257/401; 257/347
(58) Field of Classification Search ................. 257/347, 257/401
See application file for complete search history.

(56) References Cited

U.S. PATENT DOCUMENTS

| | | | |
|---|---|---|---|
| 5,675,164 A | 10/1997 | Brunner et al. | |
| 5,780,911 A | 7/1998 | Park et al. | |
| 5,965,914 A | 10/1999 | Miyamoto | |
| 6,127,702 A | 10/2000 | Yamazaki et al. | |
| 6,355,532 B1 | 3/2002 | Seliskar et al. | |
| 6,413,802 B1 | 7/2002 | Hu et al. | |
| 6,475,890 B1 * | 11/2002 | Yu | 438/574 |
| 6,562,665 B1 | 5/2003 | Yu | |
| 6,921,700 B2 * | 7/2005 | Orlowski et al. | 438/283 |
| 2002/0093053 A1 | 7/2002 | Chan et al. | |
| 2005/0035415 A1 * | 2/2005 | Yeo et al. | 257/401 |

* cited by examiner

*Primary Examiner*—Douglas M Menz
(74) *Attorney, Agent, or Firm*—Oblon, Spivak, McClelland, Maier & Neustadt, P.C.

(57) ABSTRACT

The invention relates to a field-effect microelectronic device, and the production method thereof. Said device comprises a substrate (700) and at least one improved structure (702), capable of forming one or several transistor channels. Said structure, composed of several bars stacked on the substrate, may allow space saving in the integration of field-effect transistors and the performances thereof to be improved.

6 Claims, 11 Drawing Sheets

FIELD-EFFECT MICROELECTRONIC DEVICE, CAPABLE OF FORMING ONE OR SEVERAL TRANSISTOR CHANNELS

TECHNICAL FIELD AND PRIOR ART

This invention relates to the field of integrated circuits, and more specifically to field-effect transistors.

A known field-effect transistor structure 111 is shown in FIG. 1. It includes a first area forming a source 110, a second area forming a drain 120 and rests on a substrate 100 for example based on silicon.

The source 110 and the drain 120 have a substantially rectangular shape and are partially flush with the surface of the substrate 100. The transistor structure 111 also comprises a channel in the form of a block or bar, with a shape similar to that of a parallelepiped, and enabling the source 110 and the drain 120 to be connected in the direction of its length. The channel has a length L measured in a source-drain direction as well as a width W measured in a direction parallel to a main plane of the substrate 100.

The channel is covered by a zone forming a gate 140. The gate 140 is in contact with the channel over a surface $S_1$ (not shown in FIG. 1). The gate makes it possible to control the conduction of the channel and therefore the intensity of a current passing between the source 110 and the drain 120.

It is continuously sought to enhance the performance of transistors by attempting to improve two factors which are normally incompatible: the speed of operation and the consumption of the transistors.

To increase the speed of operation, it is attempted in particular to reduce the size of transistors, which also enables the production costs to be reduced and integrated circuits to be produced with a larger number of transistors.

Reducing the size of transistors involves, for example, bringing the source and the drain closer together and producing a channel with a smaller length and width. This tendency can lead to effects that hinder the good functioning of transistors, such as "short channel effects". Thus, as the length of the transistor channel is reduced, the drain and the source have an increasing effect on the channel conduction, normally controlled by the gate. "Short channel effects" lead, among other things, to a reduction in the threshold voltage with the channel length and the drain voltage, which leads to an increase in leakage of the transistor while off. This is hardly compatible with the improvement of the performance of integrated circuits.

A second example of a field effect transistor structure 222 is shown in FIG. 2 and presented in the document [1] referenced at the end of this description. This structure makes it possible in part to solve the problem stated above, and in particular to overcome the short channel effects.

The transistor structure 222 is formed on a substrate 100. It includes a first rectangular zone forming a source 210 and a second rectangular zone forming a drain 220 resting on the substrate 100. It also comprises a channel 230 in the form of a plurality of parallelepipedic bars 202 juxtaposed on the substrate 100 and parallel to one another. The bars 202 have lengths $L_2$ and widths $W_2$. They connect, in the direction of their lengths $L_2$, the source 210 and the drain 220.

The bars 200 are mutually separated by spaces 201 having a width $W_e$. The channel 230 is covered and in contact over a surface $S_2$ (not shown in FIG. 2) with a gate 240. The extent of the surface $S_2$ influences the value of the threshold voltage of the transistor. It is preferably as small as possible so as to limit the consumption of the transistor, but must be large enough to be capable of ensuring a good current level in the channel 230.

According to document [1], this transistor structure 222 makes it possible to fight against the short channel effects and has better performance in terms of consumption than the conventional transistor structure 111 shown in FIG. 1. Indeed, for equal voltages applied to the gate 140 of the conventional transistor structure 111 and the gate 240 of the second transistor structure 222, with equal contact surfaces $S_1$ and $S_2$ between the gate and the channel, it is possible to obtain a higher channel current for the transistor structure 222 shown in FIG. 2.

The transistor structure 222 nevertheless has problems, in particular in terms of integration density.

This structure, to remain effective, generally takes up more space on a substrate on which it has been formed than a conventional structure such as structure 111 of FIG. 1. To form transistor structure 222 while taking into account constraints in terms of the current, it is attempted to produce bars 202 having the smallest possible widths $W_2$, with spaces 201 between the bars 202 which are also as small as possible. However, the choice of widths $W_2$ of the bars 202, as well as the widths $W_2$ is limited because it is dependent on the minimum sizes that can be obtained by current photolithography and etching methods, or it requires the use of complex photolithographic etching or etching methods that are difficult to reproduce.

In addition to improving the speed and consumption of transistors, it is also continuously sought to improve their integration density on chips or integrated circuits.

A microelectronic device shown in FIG. 3 and described in document [2] referenced at the end of this description in particular proposes a solution for improving the integration density of transistors in a chip. This device includes a substrate 100, preferably electrically insulating, on which three transistors 333a, 333b, 333c, are stacked, having a common gate, and mutually separated by a first inserted first dielectric layer 300a and a second inserted dielectric layer 300b. Each of the transistors 333a, 333b, 333c, comprises a rectangular zone forming a source, respectively designated 310a, 310b, 310c, and a second rectangular zone forming a drain, respectively designated 320a, 320b, 320c. Each of the sources 310a, 310b, 310c and drains 320a, 320b, 320c are respectively connected by parallelepipedic conductive bars forming channels and designated 330a, 330b, 330c.

In addition, a gate 340 common to the three transistors 333a, 333b, 333c partially covers the stack of channels 330a, 330b, 330c.

DISCLOSURE OF THE INVENTION

This invention aims to present a field-effect microelectronic device comprising a structure forming one or more transistor channels. This structure, forming one or more transistor channels, improves field-effect transistors, in particular in terms of integration density and electrical performance.

This invention relates to a field-effect microelectronic device including:

a) a substrate, b) at least one structure forming one or more channels capable of connecting, in the direction of their lengths, one or more sources and one or more drains, which structure is formed by a stack, in a direction orthogonal to a main plane of the substrate, of at least two bars having different widths producing a serrated profile, for example crenelated.

Said profile extends in at least one direction having a non-zero angle with the main plane of the substrate or in at least one direction orthogonal to the main plane of the substrate.

Said structure forming one or more channels included in the device according to the invention, can save space by comparison with a structure, such as that shown in FIG. 2, comprising juxtaposed bars.

In addition, different bar widths, or a serrated or crenelated profile of said structure forming one or more channels, make(s) it possible to improve the control of the conduction of the channel(s) by a gate that at least partially covers said structure. Indeed, the contact surface between said channel(s) and the gate is then increased. Moreover, it makes it possible to use a conduction phenomenon between the gate and the bars, confined to the level of the edges and/or the borders of the latter.

The structure can be formed only with bars capable of providing electrical conduction. It then enables a single transistor channel, comprising a serrated or crenellated profile, to be formed.

According to an alternative, said structure can be made of one or more bars capable of providing electrical conduction and one or more non-conductive bars capable, for example, of acting as a mechanical support for the other bars of the structure. Thus, the structure can make it possible to form a single channel capable of connecting a transistor source and drain, and comprising a plurality of conductive bars mutually separated by said non-conductive bars. Said non-conductive bars can be based on an insulating material such as, for example $SiO_2$. The structure can also form a plurality of channels, capable of connecting a plurality of sources and a plurality of drains of transistors, mutually separated by non-conductive bars.

The stack can include at least two successive bars based on different materials. Thus, the stack can include at least two successive bars based on different semiconductive materials or of different dopings. For example, at least two successive bars of which one is based on Si and the other is based on SiGe or, for example, of which one is based on N-doped Si and the other is based on undoped or P-doped Si.

The stack can also include at least two successive bars of which a first is based on a semiconductive material such as, for example, Si or SiGe and of which a second is based on an insulating material such as, for example, $SiO_2$.

The nature of the material forming the bars may depend in particular on the desired properties of electrical conduction to be given to said structure.

Bars based on semiconductive materials, depending on their thicknesses and/or whether or not they have been doped, are capable of providing electrical conduction.

The stack can include, for example, at least one bar based on a semiconductive material, such as silicon, SiGe (Germanium silicide), Germanium (Ge), Galium arsenide (GaAs), optionally doped, and at least one bar based on a second semiconductive material, such as Si, Ge, GaAs, SiGe, optionally doped. In addition, the stack can be made of alternating bars based on different semiconductive materials and/or having different dopings such as, for example, an alternation of Si-based bars and SiGe-based bars or an alternation of Ge-based bars and GaAs-based bars, or an alternation of SiGe-based bars and Ge-based bars, or an alternation of undoped silicon bars and N— or P-doped silicon bars.

The stack can also be made of an alternation of bars based on a semiconductive material and bars based on an insulating material such as, for example, an alternation of Si— or SiGe-based bars and $SiO_2$-based bars.

The bars can each have different thicknesses and different lengths. Bars capable of providing electrical conduction can have a thickness, for example, of between 3 and 100 nanometres and advantageously between 5 and 15 nanometres.

The bars capable of providing electrical conduction can have a low thickness, less than 10 nm, for example, between 1 nm and 10 nm, enabling a good charge carrier confinement in these bars to be obtained.

Non-conductive bars can, for example, have a thickness of between 3 and 100 nanometres. The conductive and non-conductive bars advantageously have sizes of the same amplitude.

According to a specific feature of the invention, one or more bars, for example non-conductive or semiconductive bars, can be surrounded at least partially, in a direction parallel to a main plane of the substrate, with insulating caps. These insulating caps can be based on a dielectric material such as, for example, nitride.

According to another specific feature of the field-effect microelectronic device according to the invention, the latter can also include a hard mask on said stack.

The hard mask can be based on silicon oxide or nitride, and can make it possible to prevent parasitic conduction on the top of the stack and thus prevent the formation of a parasitic channel.

According to a specific feature of the field-effect microelectronic device according to the invention, the latter can also include a gate capable of at least partially covering said structure and optionally the hard mask. The insulating caps can then make it possible, for example, to prevent electrical conduction between a gate covering said structure and the non-conductive or semiconductive bars of said structure.

The device according to the invention can also include one or more sources connected by said structure to one or more drains.

The invention also relates to a field-effect microelectronic device comprising:
 a) a substrate,
 b) at least one structure forming one or more channels capable of connecting, in the direction of their lengths, a single source and a single drain, which structure is formed by a stack, in a direction orthogonal to a main plane of the substrate, of at least two different bars, for example based on different materials and/or having different widths.

The invention also includes a method for producing a field-effect microelectronic device equipped with at least one structure comprising at least two stacked bars having different widths capable of forming one or more transistor channels. The method according to the invention includes the steps of:
 forming, on a substrate, a stack of a plurality of layers comprising at least two successive layers based on different materials,
 forming at least one mask on said stack,
 anisotropic etching of the layers through the mask,
 partial and selective etching of one or more layers of the stack.

Said mask can include a resin mask.

Said mask can advantageously include a resin mask and a hard mask stacked. The hard mask can be, for example, based on nitride or $SiO_2$ and facilitate the etching of the layers of the stack.

The hard mask can also make it possible, if it is preserved until the end of the process, to electrically insulate the top of the stack.

The partial and selective etching of the layers of the stack can advantageously be isotropic.

The stack can include at least two layers based on different semiconductive materials or of different dopings selected from the following materials: Si, SiGe, Ge, GaAs, N-doped Si, P-doped Si.

According to another specific feature of the method according to the invention, said stack can include at least one layer made of an insulating material and one layer based on a semiconductive material.

The method according to the invention can also include: the conformal deposition of a dielectric layer, for example based on nitride, on said structure. The method according to the invention can also then include at least the partial isotropic etching of said dielectric layer, so as to form insulating caps around certain bars of said structure.

According to a possible embodiment, the method according to the invention can also include: the formation of a gate at least partially covering said structure and optionally the hard mask.

According to a specific embodiment, this gate can be produced by a damascene-type process. The formation of the gate can then include steps consisting of:
- covering the structure with an insulating layer,
- forming at least one opening in the insulating layer so as to expose said structure,
- covering the structure with a gate insulating or dielectric layer such as, for example $HfO_2$ or $SiO_2$,
- filling the opening with a gate material such as, for example, polysilicon, or a refractory metal.

According to an alternative embodiment of the method, prior to the formation of the gate, one or more steps in which said structure is doped can be performed.

BRIEF DESCRIPTION OF THE DRAWINGS

This invention can be better understood from the description of embodiment examples given purely by way of indication, which are in no way limiting, in reference to the appended drawings wherein.

Identical, similar or equivalent parts of the different figures have the same numeric references to facilitate comprehension from one figure to another.

The different parts shown in the figures are not necessarily shown according to a uniform scale, in order to make the figures easier to read.

DETAILED DESCRIPTION OF SPECIFIC EMBODIMENTS

Figure 1:
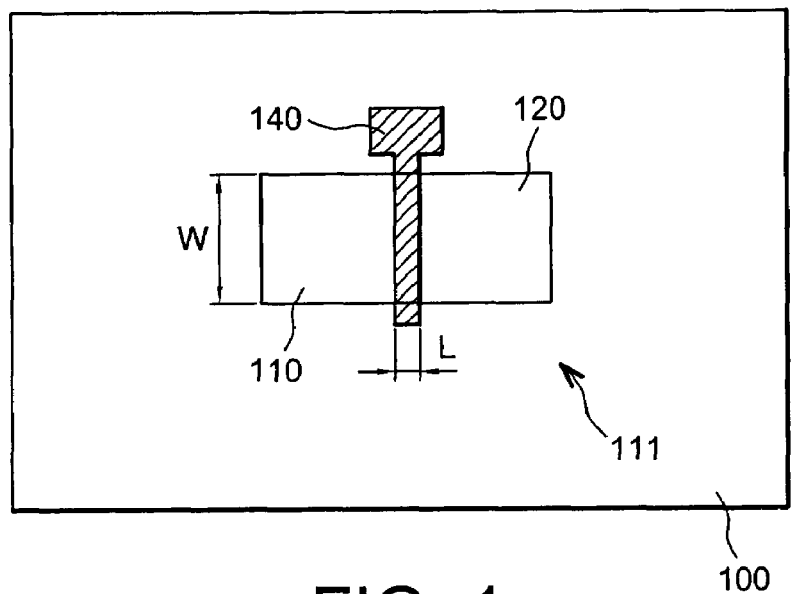
FIGS. 1, 2 and 3 described above show field-effect transistor structures each comprising a channel structure according to the known prior art.
Figure 2:
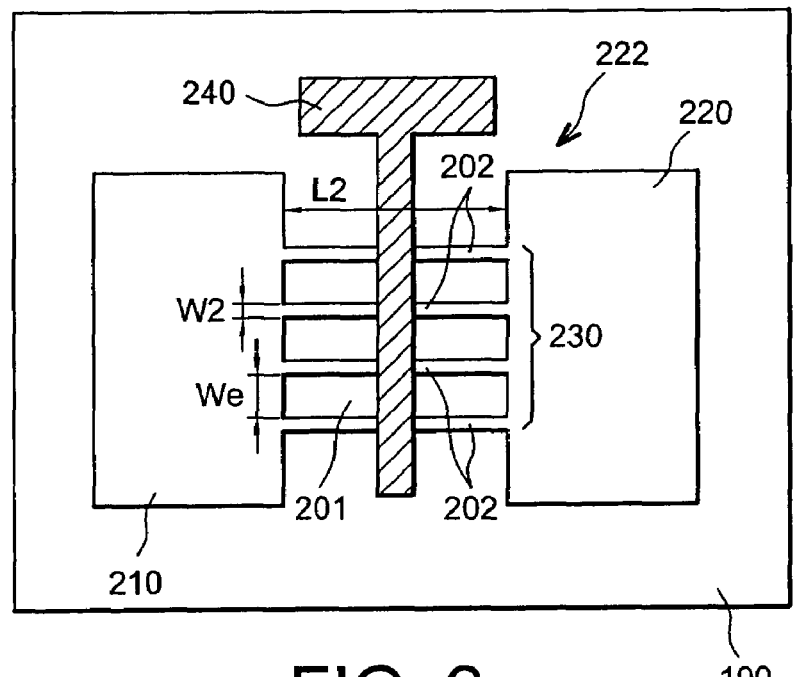
Figure 3:
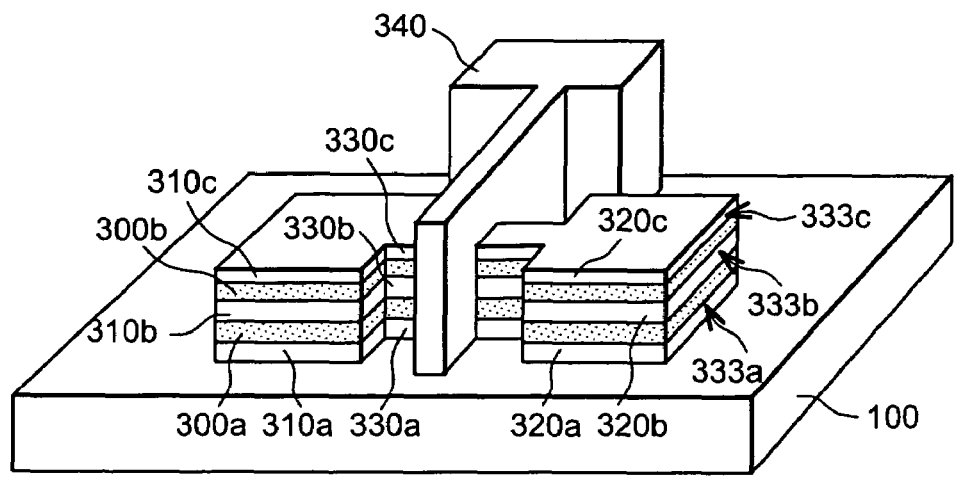
Figure 4:
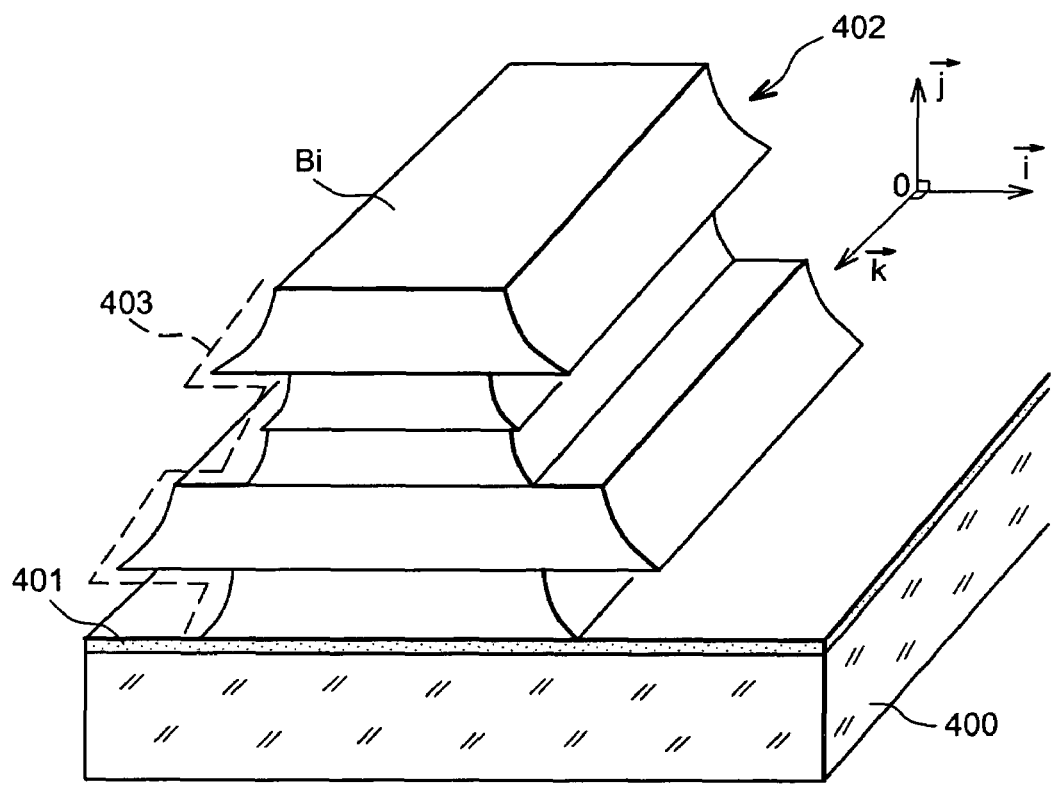
FIGS. 4, 5, 6A, 6B, 7 and 8 show examples of field-effect microelectronic devices according to the invention.

FIG. 4 shows an example of a microelectronic device according to the invention. It shows a substrate 400, for example, based on a semiconductive material, covered with an insulating layer 401. A structure 402 rests on the substrate 400. It is formed as a stack, in a direction orthogonal to a main plane of the substrate 400, of a plurality of bars $B_i$, based, for example, on a semiconductive material.

The term main plane of the substrate 400 refers to a plane parallel to the surface of the layer 401, or passing through the substrate 400 and parallel to a plane $[O; \vec{i}; \vec{k}]$ of an orthogonal reference $[O; \vec{i}; \vec{j}; \vec{k}]$ shown in FIG. 4.

This device can be obtained using thin layer production methods. The term bar refers to blocks, zones or blades with substantially parallelepipedic shapes extracted from thin films.

The bars are obtained, for example, by etching thin films. However, some thin film etching methods do not always make it possible to obtain perfect geometric shapes. Thus, when the term "bar" is used in this description, it is not limited to bars or blocks having a perfectly parallelepipedic shape. Bars having a shape similar to that of a parallelepiped should also be included.

The bars Bi of the structure 402 have different widths, measured in a direction parallel to that defined by the vector $\vec{i}$ of the orthogonal reference $[O; \vec{i}; \vec{j}; \vec{k}]$. The result is that the structure 402 has a serrated profile 403 (shown with a dotted line in FIG. 4), extending in at least one direction orthogonal to the main plane or in a direction having a non-zero angle with the main plane of the substrate. If the bars have a shape very similar to the parallelepiped shape, the serrated profile 403 can be a crenellated profile.

Figure 5:
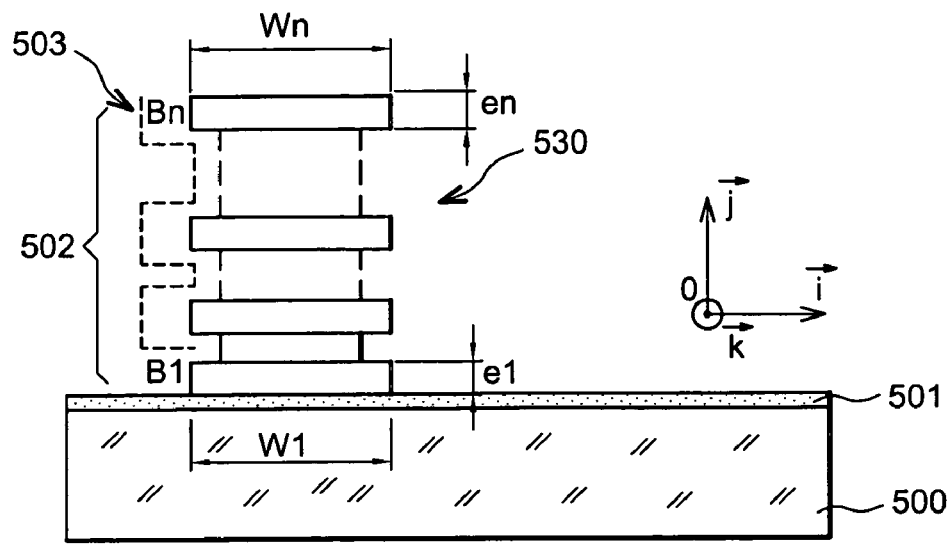

FIG. 5 shows another example of the microelectronic device according to the invention.

A substrate 500, for example, based on a semiconductive material such as, for example, silicon, is covered with an insulating layer, for example, based on $SiO_2$. A structure 502 formed as a stack of a plurality of bars $B_1, \ldots, B_n$ rests on the insulating layer 501.

The bars $B_1, \ldots, B_n$ are stacked in a direction orthogonal to a main plane of the substrate 500, i.e. a direction parallel to the direction defined by a vector $\vec{j}$ of the orthogonal reference $[O; \vec{i}; \vec{j}; \vec{k}]$ shown in FIG. 5.

The bars $B_1, \ldots, B_n$ each have a substantially parallelepiped shape and are shown according to a transverse cross-section.

The bars $B_1, \ldots, B_n$ have lengths that can be identical or different, and that are measured in a direction parallel to the direction defined by the vector $\vec{k}$ of the orthogonal reference $[O; \vec{i}; \vec{j}; \vec{k}]$. The lengths of the bars $B_1, \ldots, B_n$ are not referenced in FIG. 5, given the transverse cross-section view.

The bars $B_1, \ldots, B_n$ have different widths $W_1, \ldots, W_n$ measured in a direction parallel to that defined by the vector $\vec{i}$ of the reference $[O; \vec{i}; \vec{j}; \vec{k}]$. The widths are, for example, between 10 nanometres and 1 μm. As the bars $B_1, \ldots, B_n$ have different widths, the structure 502 has a serrated profile 503 shown with a dotted line in FIG. 5, which extends in at least one direction orthogonal to the main plane of the substrate 500.

The bars $B_1, \ldots, B_n$ can also have thicknesses $e_1, \ldots, e_n$ different from one another, measured in a direction parallel to that defined by the vector $\vec{j}$ of the reference $[O; \vec{i}; \vec{j}]; \vec{k}$. The thicknesses are, for example, between 3 and 100 nanometres or advantageously between 5 and 15 nanometres.

The n bars $B_1, \ldots, B_n$ can all be based on the same semiconductive material or based on a plurality of different semiconductive materials, such as, for example, silicon, optionally doped, or SiGe, optionally doped, Germanium, optionally doped, or Gallium arsenide, optionally doped.

Structure 502 forms a transistor channel 530 having a serrated profile 503 capable of being attached to a first zone on the substrate 500 forming a source (not shown in FIG. 5) and a second zone on the substrate 500 forming a drain (not shown in FIG. 5).

The channel 530 can be covered with a gate coming into contact with the serrated profile 503. This serrated profile 503 will make it possible, in this case, to obtain a larger contact surface between said gate and the channel 530 than that obtained with a conventional channel of the same size but with a planar profile.

Figure 6A:
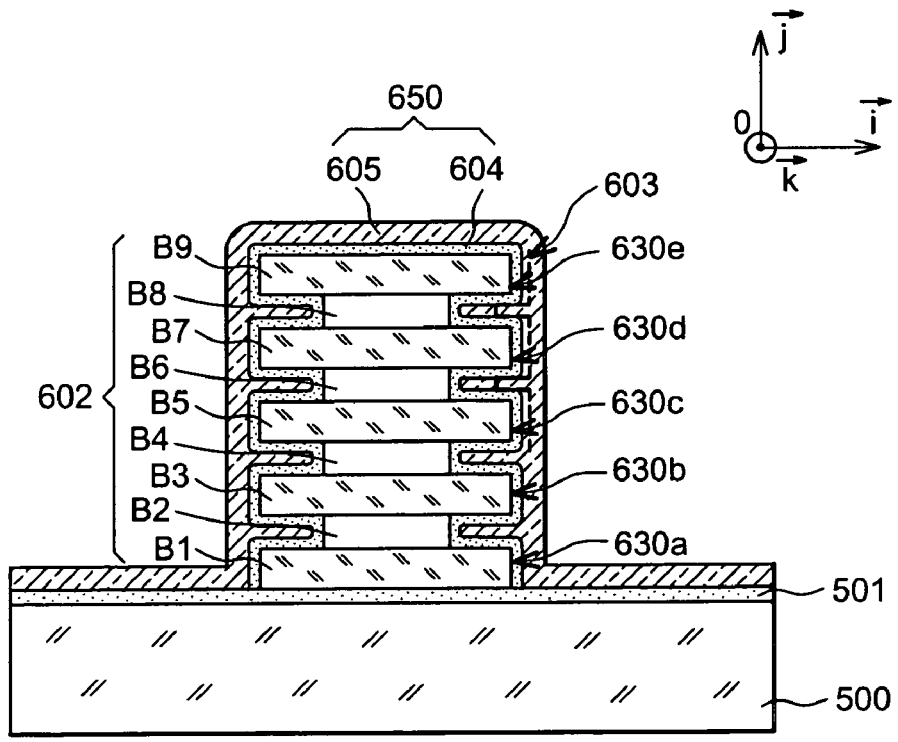

FIG. 6A shows another example of a microelectronic device according to the invention. A structure 602, resting on a substrate 500 covered with an insulating layer 501, is formed as a stack of 9 bars $B_1, \ldots, B_9$ stacked in this order, and each having a substantially parallelepiped shape.

The bars $B_1, \ldots, B_9$ are shown in FIG. 6A according to a transverse cross-section. Bars $B_1, B_3, B_5, B_7, B_9$, have respective widths $W_1, W_3, W_5, W_7, W_9$, substantially the same, measured in a direction parallel to that defined by the vector $\vec{i}$ of the orthogonal reference [O; $\vec{i}$; $\vec{j}$; $\vec{k}$] shown in FIG. 6A. The widths $W_1, W_3, W_5, W_7, W_9$ are, for example, between 5 nm and several micrometers (for example, 5 μm) and advantageously between 10 nm and 100 nm. Bars $B_1, B_3, B_5, B_7, B_9$, are stacked so as to alternate with bars $B_2, B_4, B_6, B_8$, having respective widths $W_2, W_4, W_6, W_8$, for example, between 5 nm and several μm (for example 5 μm), advantageously between 5 nm and 95 nm, and smaller than the widths $W_1, W_3, W_5, W_7, W_9$.

The bars $B_1, \ldots, B_9$ also have lengths different from one another, measured in a direction parallel to that defined by the vector $\vec{k}$ of the orthogonal reference [O; $\vec{i}$; $\vec{j}$; $\vec{k}$].

The bars $B_1, \ldots, B_9$ are based on a semiconductive material such as, for example, silicon, optionally doped. By virtue of their nature or composition and/or the level of doping of the semiconductive material, bars $B_1, B_3, B_5, B_7, B_9$ are capable of providing electrical conduction. They can thus form a transistor channel or optionally a plurality of transistor channels.

Bars $B_1, B_3, B_5, B_7, B_9$, have thicknesses $e_1, e_3, e_5, e_7, e_9$, measured in directions parallel to those defined by the vector $\vec{j}$ of the orthogonal reference [O; $\vec{i}$; $\vec{j}$; $\vec{k}$]. The thicknesses $e_1, e_3, e_5, e_7, e_9$, are, for example, less than 15 nanometres, so as to enable a charge carrier confinement in bars $B_1, B_3, B_5, B_7, B_9$ when the latter provide electrical conduction.

Bars $B_2, B_4, B_6, B_8$ have thicknesses $e_2, e_4, e_6, e_8$, for example, between 3 and 100 nanometres, advantageously between 5 and 15 nanometres. They can include a semiconductive material such as, for example, undoped SiGe or an insulating material such as $SiO_2$. Bars $B_2, B_4, B_6, B_8$, are non-conductive or semiconductive, and can, for example, provide mechanical support for the structure 602 and insulation between bars $B_1, B_3, B_5, B_7, B_9$.

By virtue of the different widths of the bars $B_1, \ldots, B_9$ and the substantially parallelepiped shape of said bars, the structure 602 has a crenellated profile 603 which extends in at least one direction orthogonal to a main plane of the substrate 500.

Structure 602 is also covered with a gate 650 first formed by a gate insulating layer 604, having a thickness, for example, between 0.5 nm and 50 nm, which matches the crenelated profile. The gate insulating layer 604 can, for example, be based on $SiO_2$ or $Si_3N_4$ or any other dielectric material capable of acting as a gate insulating layer.

The gate 650 is also made of another layer of gate material 605 covering the gate insulating layer 604 and embracing the crenellated profile. The gate material layer 605 can be based, for example, on a semiconductive material, such as polysilicon, optionally doped or silicided (partially or totally), SiGe or even based, for example, on a refractory metal. The crenellated profile 603 enables the gate 650 to have a large surface in contact with the structure 602 and, consequently, a good conduction surface with bars $B_1, B_3, B_5, B_7, B_9$, capable of providing electrical conduction.

The crenelated profile 603 can also enable confined conduction in the corners of bars $B_1, B_3, B_5, B_7, B_9$, when the latter provide electrical conduction.

The structure 602 is capable of connecting, in the direction of its length, parallel to a main plane of the substrate 500, a first region made on the substrate 500 forming a plurality of transistor sources, and a second region also made on the substrate 500 forming a plurality of transistor drains. Bars $B_1, B_3, B_5, B_7, B_9$ of structure 602 then form five channels 630a, 630b, 630c, 630d, 630e, aligned and mutually parallel in a plane orthogonal to a main plane of the substrate. The channels are mutually separated by non-conductive or semiconductive bars $B_2, B_4, B_6, B_8$.

The number of bars of the structure as well as the number of channels formed by the structure is not limited.

Figure 6B:
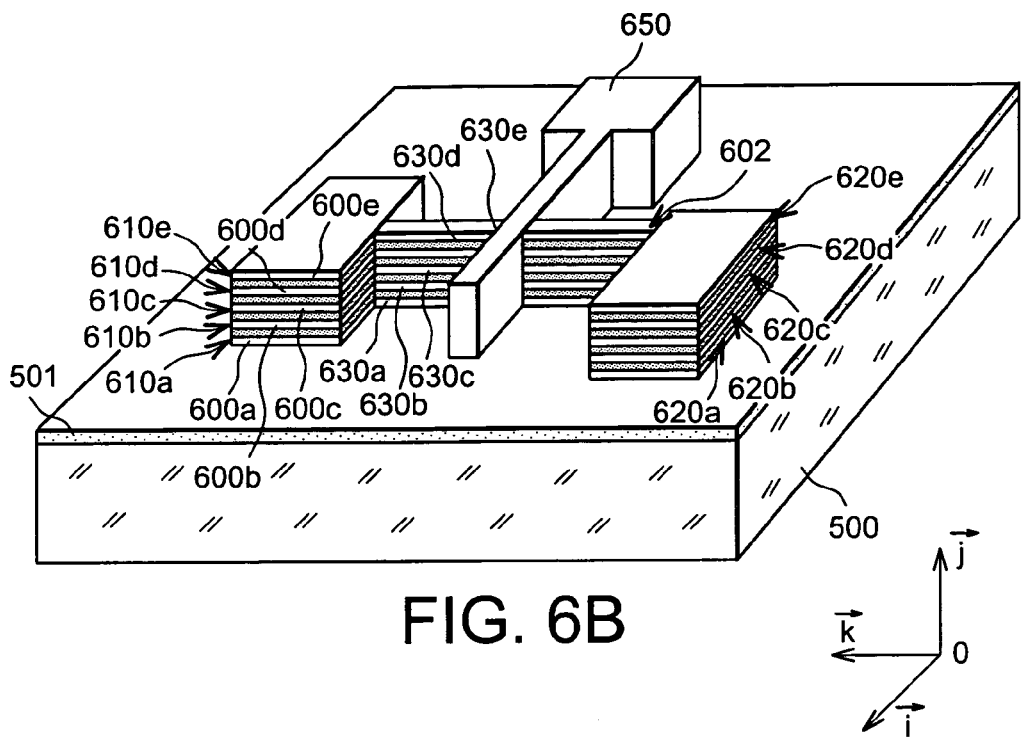

FIG. 6B shows an alternative of the microelectronic device shown in FIG. 6A. The structure 602 described above is shown in FIG. 6B in its entire length and in perspective. The orthogonal reference [O; $\vec{i}$; $\vec{j}$; $\vec{k}$] shown in FIG. 6B is the same as that of FIG. 6A.

The microelectronic device of FIG. 6B differs from that of FIG. 6A in that it also includes a first region on the substrate 500 comprising 5 stacked sources 610a, 610b, 610c, 610d, 610e of different transistors. The sources are mutually separated by 4 layers 600a, 600b, 600c, 600d which are non-conductive and, for example, based on an insulating material such as $SiO_2$ or a semiconductive material and, for example, based on a semiconductive material such as SiGe. The sources 610a, 610b, 610c, 610d, 610e are connected via the 5 channels 630a, 630b, 630c, 630d, 630e of the structure 602, to a second region comprising 5 drains 620a, 620b, 620c, 620d, 620e of different transistors also stacked and also mutually separated by 4 non-conductive or semiconductive layers 600a, 600b, 600c, 600d. A gate 650 is common to the channels 630a, 630b, 630c, 630d, 630e. The gate 650 partially covers the structure 602, in a direction parallel to that defined by the vector $\vec{k}$ of the reference [O; $\vec{i}$; $\vec{j}$; $\vec{k}$]. The gate 650 is, however, in contact with all of the channels 630a, 630b, 630c, 630d, 630e, by means of the gate oxide.

According to a specific feature of the microelectronic device shown in FIG. 6B, the stack of sources 610a, 610b, 610c, 610d, 610e and the stack of drains 620a, 620b, 620c, 620d, 620e creates a crenellated profile, such as that of the structure 602.

Figure 7:
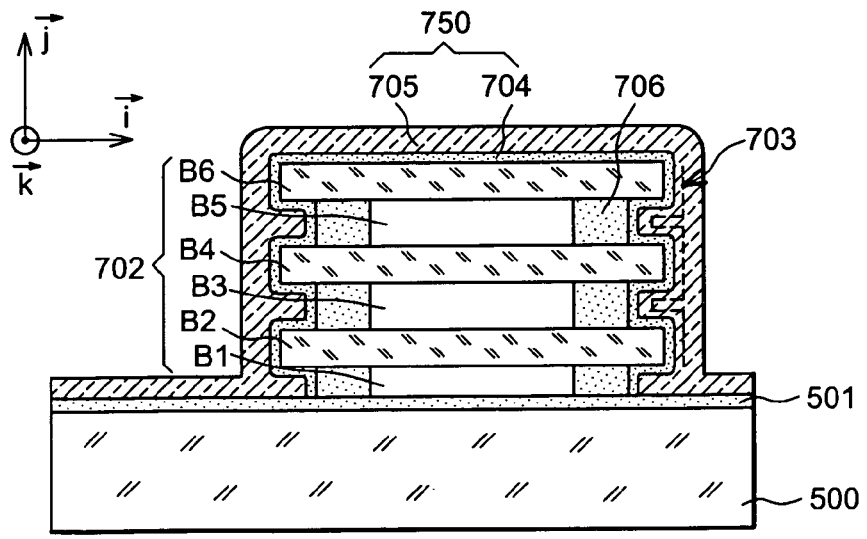

FIG. 7 shows another example of a microelectronic device according to the invention including a substrate 500 covered by an insulating layer 501. A structure 702 comprising 6 bars $B_1, \ldots, B_6$ from thin layers rests on the insulating layer 501. The bars $B_1, \ldots, B_6$ are shown according to a transverse cross-section in FIG. 7. They have mutually differing widths, measured in a direction parallel to that defined by the vector $\vec{i}$ of the orthogonal reference [O; $\vec{i}$; $\vec{j}$; $\vec{k}$].

Structure 702 also has a crenellated profile 703. Bars $B_2, B_4, B_6$, are capable of providing electrical conduction.

Bars $B_1$, $B_3$, $B_5$, are non-conductive and can be based on an insulating material such as $SiO_2$. They can also be semiconductive, based on a material such as SiGe, for example, undoped, and provide only very low conduction by comparison with bars $B_2$, $B_4$, $B_6$, or even close to zero conduction.

Structure 702 also comprises insulating caps surrounding bars $B_1$, $B_3$, $B_5$ and extending in the same direction as the latter. The insulating caps 706 can be based on a dielectric material such as, for example, nitride.

The structure 702 is covered with a gate insulating layer 704 having a thickness, for example, between 2 and 50 nanometres, which matches the crenellated profile 703. The gate insulating layer 704 can be, for example, based on $SiO_2$ or $Si_3N_4$, or any other dielectric material capable of acting as a gate insulating layer. The gate insulating layer 704 is covered with a second layer 705 embracing the crenellated profile 703 of the structure 702. The layer 705 is, for example, based on a semiconductive material such as polysilicon, optionally doped, SiGe, etc. or a refractory metal. The assembly formed by the gate insulating layer 704 and the layer 705 forms a gate 750 for one or more transistors.

The insulating caps 706 described above can serve to prevent any electrical conduction between the gate and bars $B_1$, $B_3$, $B_5$.

Bars $B_2$, $B_4$, $B_6$ can form one or more transistor channels, in which the structure 702 is connected to one or more transistor sources and one or more transistor drains.

Figure 8:
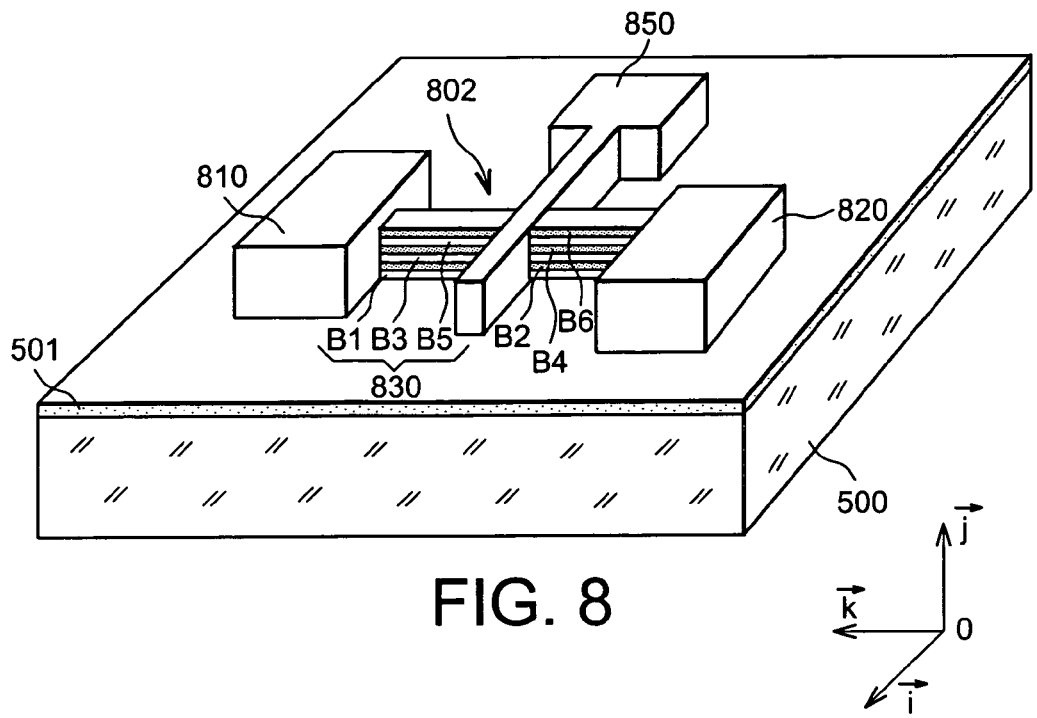

FIG. 8 shows another example of a microelectronic device according to the invention: the device includes a substrate 500, covered with an insulating layer 501. A first zone forming a source 810 as well as a second zone forming a drain 820 rest on the insulating layer 501. The source 810 and the drain 820 are mutually connected by a structure 802 formed by a stack, in a direction orthogonal to a main plane of the substrate, of 6 bars $B_1, \ldots, B_6$, based on different materials. The structure 802 can be formed, for example, by an alternation of bars based on a semiconductive material $B_1$, $B_3$, $B_5$, and bars based on an insulating material $B_2$, $B_4$, $B_6$. The bars in this example have substantially identical lengths and widths. Bars $B_1$, $B_3$, $B_5$, are capable of providing electrical conduction between the source 810 and the drain 820, and the three therefore form a single transistor channel 830 connecting the source 810 and the drain 820. A gate 850, capable of controlling the conduction of the channel 830, partially covers the structure 802 in a direction parallel to that defined by a vector $\vec{k}$ of the reference $[O; \vec{i}; \vec{j}; \vec{k}]$ shown in FIG. 8.

According to an alternative of the device shown in FIG. 8, structure 802 is replaced by structure 702 including a crenellated profile 703 shown in FIG. 7 and described above.

A first example of a method for producing a field-effect microelectronic device according to the invention will now be described. It is shown in FIGS. 9A to 9H.

Figure 9A:
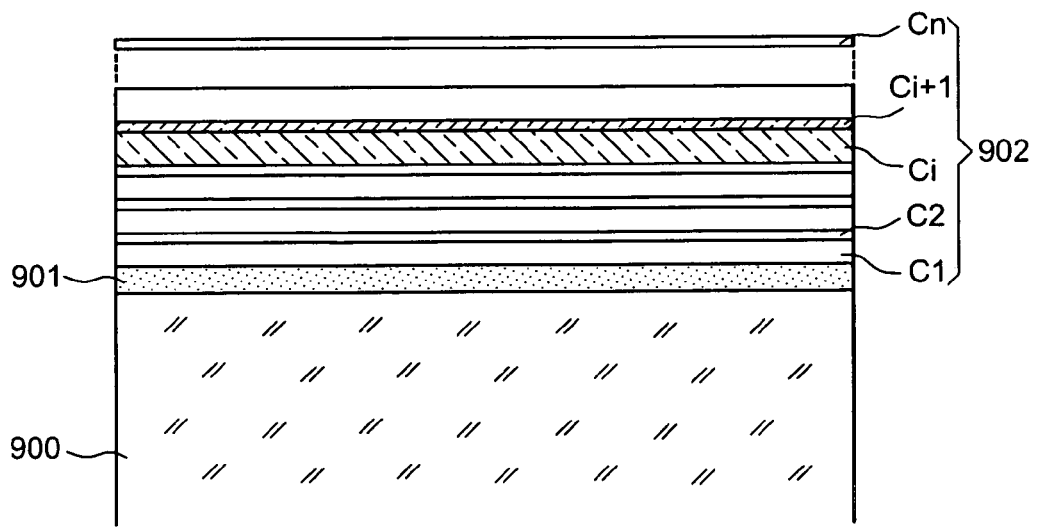
FIGS. 9A to 9H show a first example of a method for producing a microelectronic device according to the invention.

The first step of this method shown in FIG. 9A consists of producing a stack 902 of n layers $C_1, \ldots, C_n$ (with n greater than 2, a portion of the stack being diagrammatically shown with non-continuous lines), on a substrate 900. The substrate 900 can be based on silicon and covered with an insulating layer 901, for example a SIMOX layer (layer of separation by oxygen implantation) based on $SiO_2$. The n stacked layers can be produced, for example, by epitaxy, or for example by CVD (for chemical vapour deposition) in particular by epitaxy. The layers $C_1, \ldots, C_n$ have thicknesses $e_1, \ldots, e_n$ which can be mutually different and measured in a direction orthogonal to a main plane of the substrate 500.

The thicknesses $e_1, \ldots, e_n$ can be, for example, between 3 and 100 nanometres or between 5 and 15 nanometres. The layers $C_1, \ldots, C_n$ can be based, for example, on different semiconductive materials such as silicon or SiGe or GaAs or Ge. Some of the layers of the stack 902 can also be based on an insulating material such as, for example, $SiO_2$.

The stack 902 includes at least two successive layers $C_i, C_{i+1}$ (with $i \in [1;n]$) of different materials. If the layer $C_i$ is based on a first semiconductive material such as Si, the layer can be based on a semiconductive material different from the first, such as, for example, SiGe or based on a second doped semiconductive material, with a doping different from that of the first material such as, for example, N— or P-doped Si. The second material can also be based on an insulating material such as, for example $SiO_2$.

According to a specific feature of the method according to the invention, the stack can be made by alternating layers based on a semiconductive material such as silicon and layers based on an insulating material such as, for example $SiO_2$, or by alternating layers based on a semiconductive material and layers based on a second semiconductive material.

The stack can be made, for example, by alternating Si-based layers and SiGe-based layers or, for example, by alternating Ge-based layers and AsGa-based layers, or, for example, by alternating SiGe-based layers and Ge-based layers, or, for example, by alternating N— or P-doped Si-based layers and undoped Si-based layers.

Figure 9B:
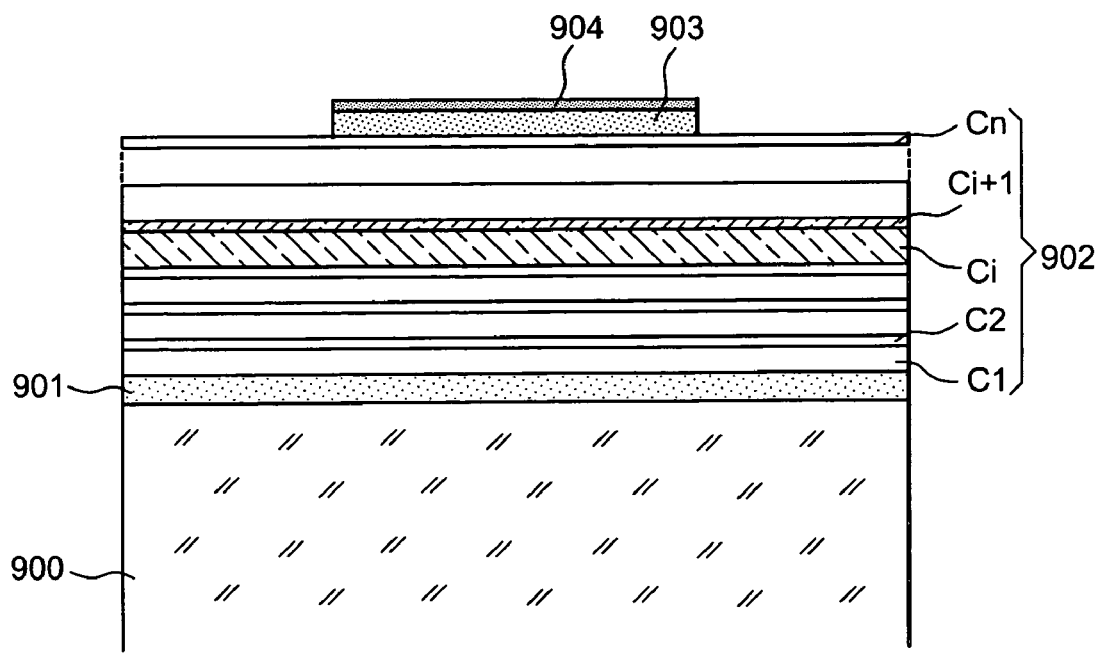

Once the stack 902 has been produced, a hard mask is deposited on the stack 902, for example, based on $Si_3N_4$ or $SiO_2$ or based on any other material capable of protecting the stack 902 from etching, such as, for example, plasma etching. Then, a photosensitive resin layer, for example, based on polyimide, is deposited on the hard mask layer. A resin mask 904 comprising one or more patterns is defined in the resin layer, for example by a photolithography method. Then, the hard mask layer protected by the resin mask 904 is subjected to anisotropic etching so as to produce a hard mask 903 under the resin mask 904 reproducing the patterns of the latter (FIG. 9B).

Figure 10:
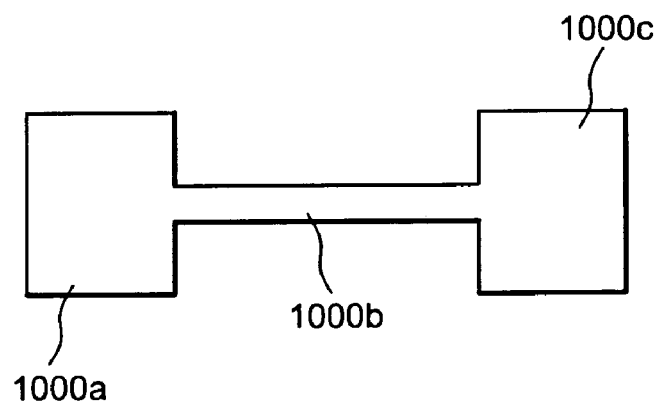
FIG. 10 shows an example of a possible pattern for a hard mask used in the example of the production method according to the invention shown in FIGS. 9A to 9H and described below.

The hard mask 903 comprises at least one transistor channel pattern 1000b, for example, having a rectangular shape, like that shown in FIG. 10, connecting a transistor source pattern 1000a and a transistor drain pattern 1000c.

The resin mask 904 is then removed by a conventional stripping method, for example, using an oxidative plasma. Next, a step of etching n layers $C_1, \ldots, C_n$ located under the hard mask 903 is performed.

According to an alternative of the method, once the stack 902 has been produced, a resin layer can be deposited directly on the stack without depositing a hard mask layer, then the resin mask 904 can be formed by photolithography. The first etching step is then performed through the resin mask 904.

Figure 9C:
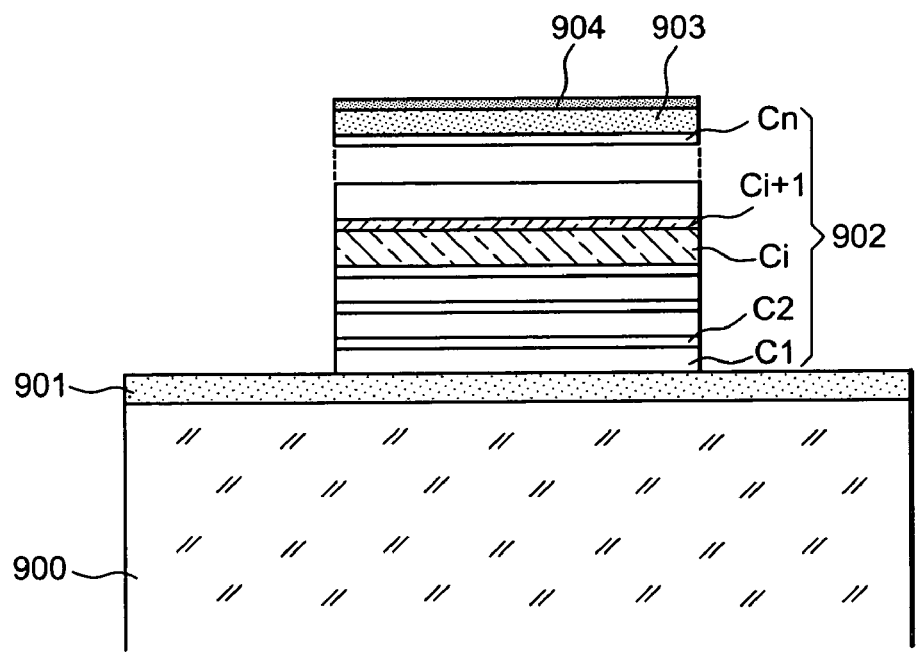

The first etching step can include the anisotropic etching of n layers $C_1, \ldots, C_n$ through the hard mask 903, so that the n etched layers $C_1, \ldots, C_n$ of the stack reproduce the patterns of the hard mask 903 (FIG. 9C) and in particular the channel pattern 1000b of the hard mask (not shown in FIG. 9C).

Figure 9D:
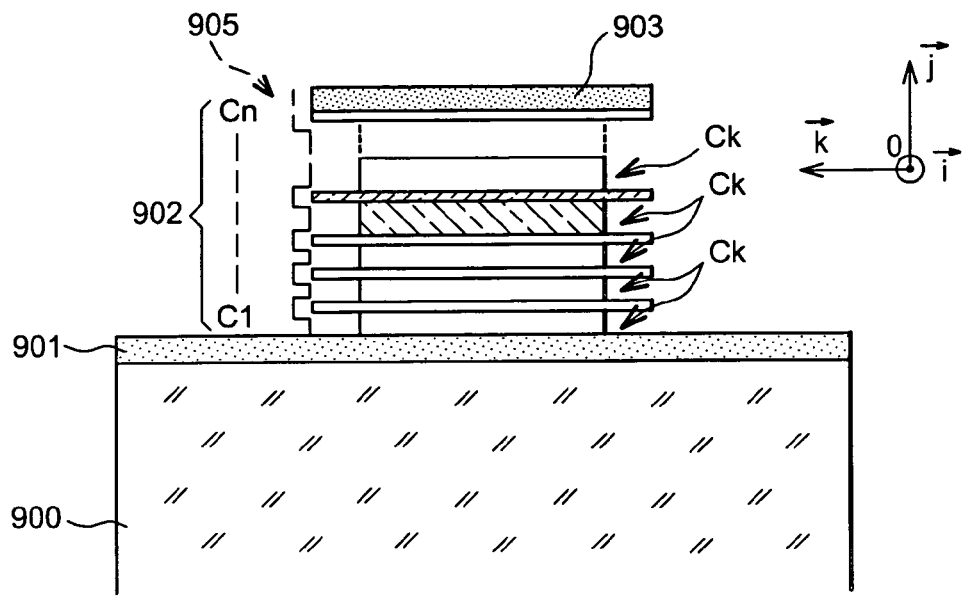

Then, a second step involving the selective isotropic etching of one or more layers $C_k$ ($k \in [1,n]$) among the n layers $C_1, \ldots, C_n$ is performed, and enables the layers $C_k$ to be partially removed (FIG. 9D). The layers $C_k$ of the stack 902 have smaller extents than the other layers. The result is that the stack 902 comprises a serrated profile 905 extending in at least one direction orthogonal to the main plane of the substrate 900 or in at least one direction presenting a non-zero angle with the main plane of the substrate 900.

The second selective etching step preferably affects the layers $C_k$ and leaves the other layers intact.

According to a specific feature of the method according to the invention, the layers $C_k$ partially removed by the selective etching are based on a first semiconductive material such as, for example, SiGe, while the other layers of the stack are based, for example, on a second semiconductive material such as Si. The layers Ck partially removed by the selective etching can also be based on an insulating material such as $SiO_2$, while the other layers of the stack are based on a semiconductive material such as Si.

Figure 9E:
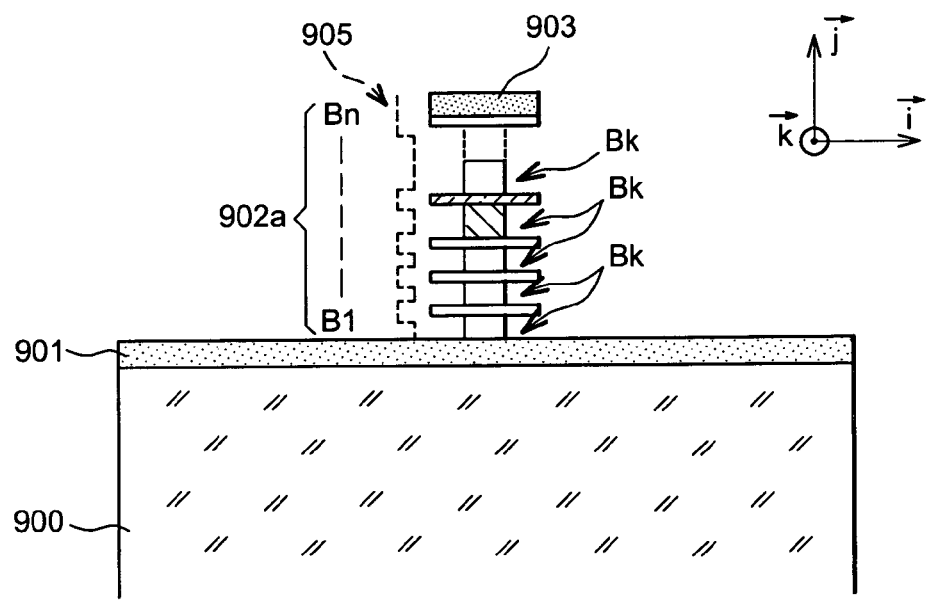

FIG. 9E shows a cross-section view of a portion of the stack 902. The cross-section is shown in a plane orthogonal to the plane [O; $\vec{j}$ ; $\vec{k}$] of the orthogonal reference [O; $\vec{i}$ ; $\vec{j}$ ; $\vec{k}$] common to FIGS. 9D and 9E.

The portion of the stack 902 shown in FIG. 9E is that found under, and which reproduces the channel pattern (shown and designated as 1000b in FIG. 10) of the hard mask 903.

This portion of the stack is presented in the form of a structure 902a made of n stacked bars $B_1, \ldots, B_n$ having a substantially parallelepipedic shape (a portion of the stack being diagrammatically shown with non-continuous lines in FIG. 9E). The bars $B_1, \ldots, B_n$ are portions of the etched layers $C_1, \ldots, C_n$ which reproduce the channel pattern of the hard mask 903. The bars $B_1, \ldots, B_n$ are shown according to a transverse cross-section. Said structure 902a comprises some bars $B_k$, k ∈ [1,n], corresponding to a portion of selectively-etched layers $C_k$. These bars $B_k$ have widths $W_k$, measured in directions parallel to that defined by the vector $\vec{i}$ of the orthogonal reference [O; $\vec{i}$ ; $\vec{j}$ ; $\vec{k}$], smaller than those of the other bars.

As the stacked bars $B_1, \ldots, B_n$ have different widths, the structure 902a also has a serrated profile 905.

According to a specific feature of the method, the serrated profile 905 of the stack 902 can be a crenellated profile. Indeed, depending on the quality of the aforementioned selective etching, the bars $B_k$ can have a shape similar to a perfectly parallelepipedic shape. Stacked bars having a shape similar to a perfectly parallelepipedic shape and mutually differing widths create a crenellated profile.

Depending on the nature of the materials that constitute the bars $B_1, \ldots, B_n$, the structure 902a can comprise one or more bars capable of providing electrical conduction and, optionally, comprise one or more non-conductive bars. The structure 902a is thus capable of forming one or more transistor channels aligned and parallel in the plane [O; $\vec{i}$ ; $\vec{k}$] of the orthogonal reference [O; $\vec{i}$ ; $\vec{j}$ ; $\vec{k}$].

Figure 9F:
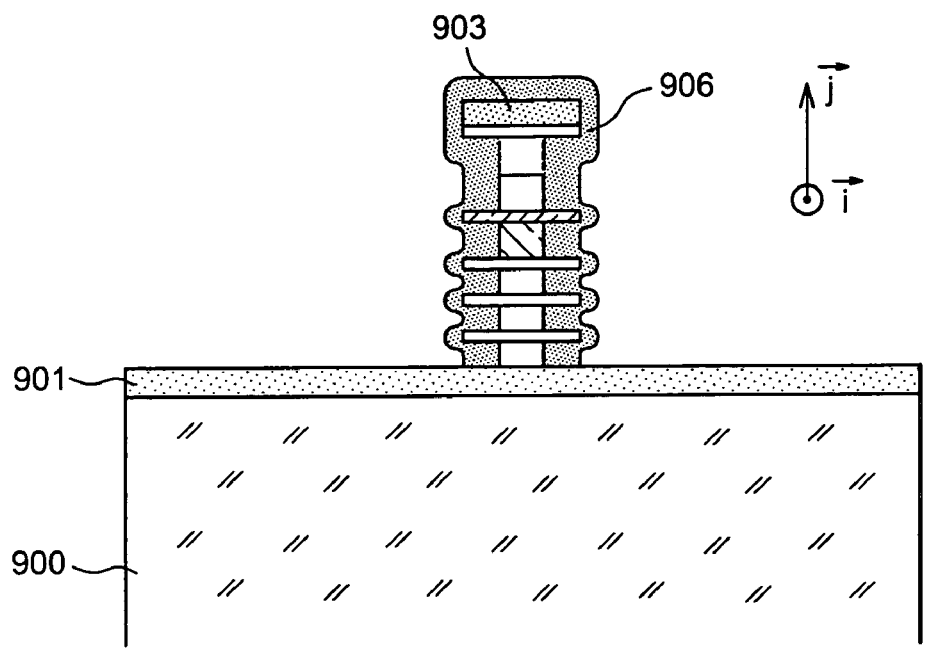

According to another specific feature of the method according to the invention, it is possible to add, to the structure 902a, insulating caps 907 surrounding the bars $B_k$ in a direction parallel to a main plane of the substrate 900, i.e. in a direction parallel to the plane [O; $\vec{i}$ ; $\vec{k}$]. The formation of the insulating caps 907 includes a step of conformal deposition of a dielectric layer 906, for example, of 20 to 50 nanometres of nitride on the structure 902a (FIG. 9F).

Figure 9G:
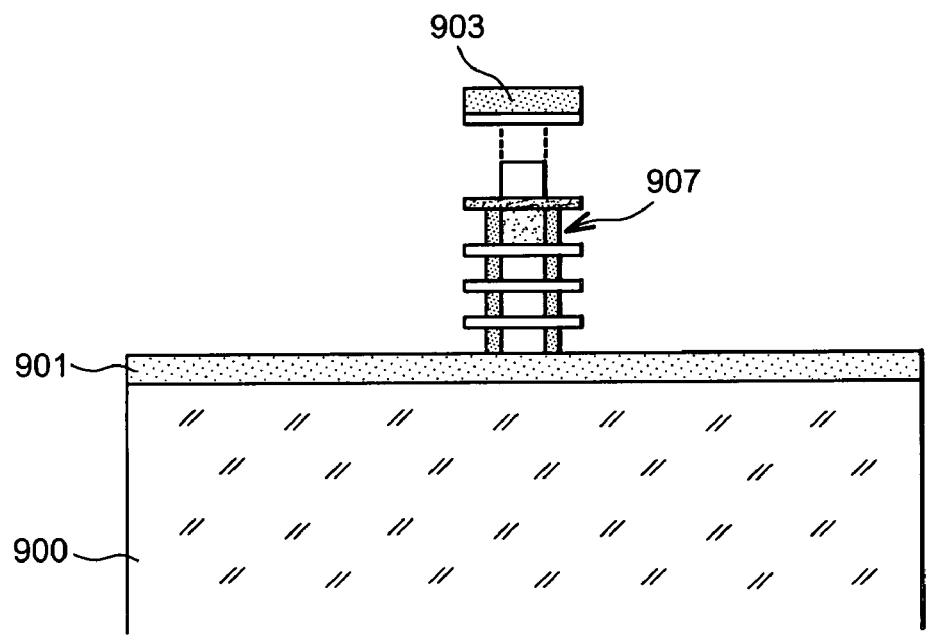

Then, this dielectric layer 906 is subjected to partial isotropic etching. This partial etching is performed so as to retain a thickness of the dielectric layer 906, preferably only around the bars $B_k$. This thickness is enough to limit the electrical influence on the bars $B_k$ of a gate that may subsequently be formed on the structure 902a. For example, this thickness will be 10 times greater than that of an insulating layer of a gate that may subsequently be formed on the structure 902a. The remaining thickness of the dielectric layer then forms the insulating caps 907 (FIG. 9G).

According to a specific feature of the method according to the invention, once the structure 902a has been produced, a gate at least partially covering said structure 902a, in a direction parallel to the vector $\vec{i}$, can then be carried out.

According to an alternative of the method, and depending on the nature of the bars $B_1, \ldots, B_n$, prior to the formation of the gate, one or more steps involving the doping of the structure 902a can be performed. This doping can, for example, be P-type for NMOS transistors and, for example, N-type for PMOS transistors. These doping steps can make it possible in particular to reduce the short channel effects.

The formation of the gate can be performed first by deposition, preferably conformal, of a gate insulating layer 908, for example, using an insulating material having a thickness of 2 to 50 nanometres, such as, for example $Si_3N_4$, $SiO_2$, or an insulating material having a high dielectric constant. The gate insulating layer 908 matches the serrated profile of the structure 902a. Then, above the gate insulating layer 908, a gate material layer 909, which is semiconductive, for example, based on SiGe or polysilicon, or conductive, for example, based on molybdenum, or TiN, is deposited.

The gate insulating layer 908 and the gate material layer 909 are then etched to form a gate 910. The gate 910 can be common to a plurality of channels, depending on whether the structure 902a forms one or more transistor channels.

Figure 9H:
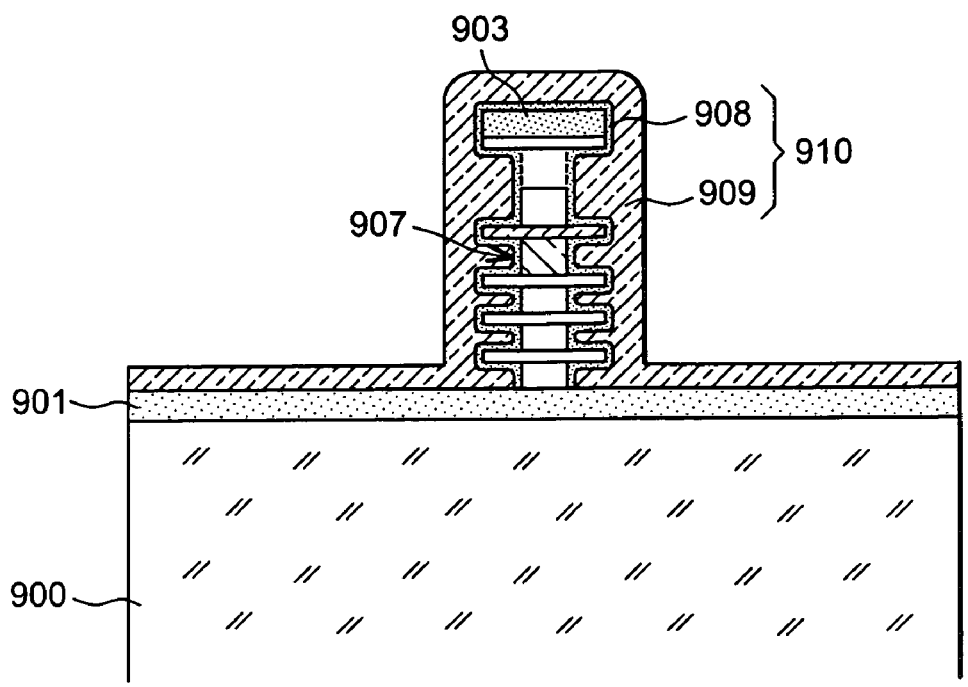

FIG. 9H shows a device according to the invention obtained after the aforementioned gate formation step. The structure 902a rests on the insulating layer 901 covering the substrate 900. The hard mask 903 has been preserved and covers the top of the structure 902a. The gate 910 formed by the gate insulating layer 908 and the semiconductive material layer 909 coats the structure 902a and the hard mask 903.

Preserving the hard mask 903 on the structure 902a can thus make it possible to prevent parasitic conduction between the gate 910 and the top of the structure 902a.

According to an alternative of the method according to the invention, the hard mask 903 can be removed prior to the formation of the gate 910.

According to a specific feature of the method according to the invention, a first zone forming a drain and a second zone forming a source, based on a semiconductive material, can be produced after the formation of the structure 902a by ion implantation of dopants (for example: As, Pb, B, BF2) so that the structure 902a connects the source and the drain in the direction of its width. The structure 902a then forms one or more transistors aligned and parallel to one another in a plane orthogonal to a main plane of the substrate.

Figure 11A:
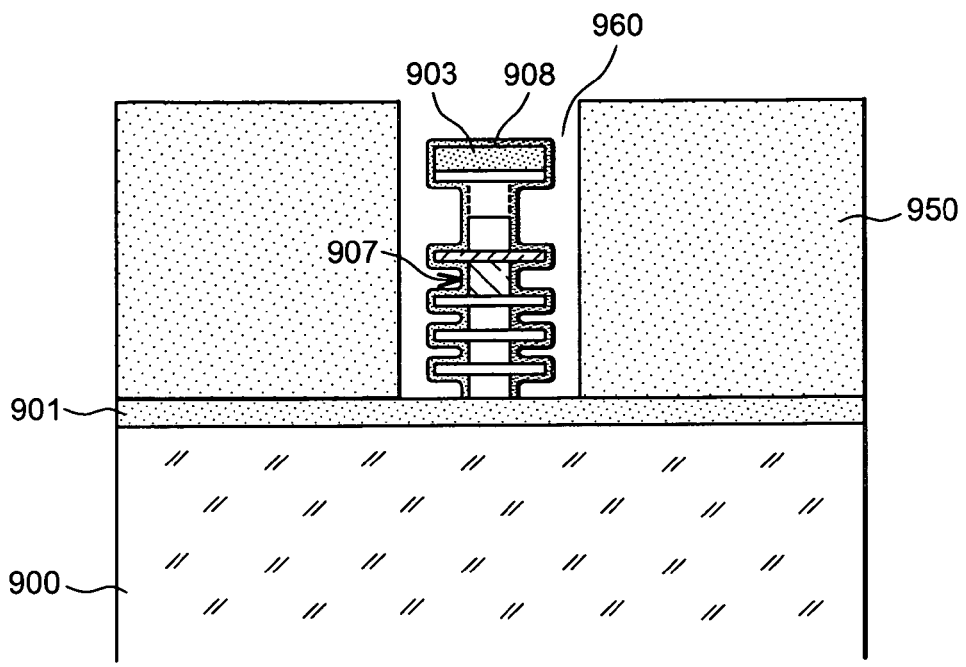
FIGS. 11A to 11D show a specific embodiment of a method for producing a microelectronic device according to the invention.
Figure 11B:
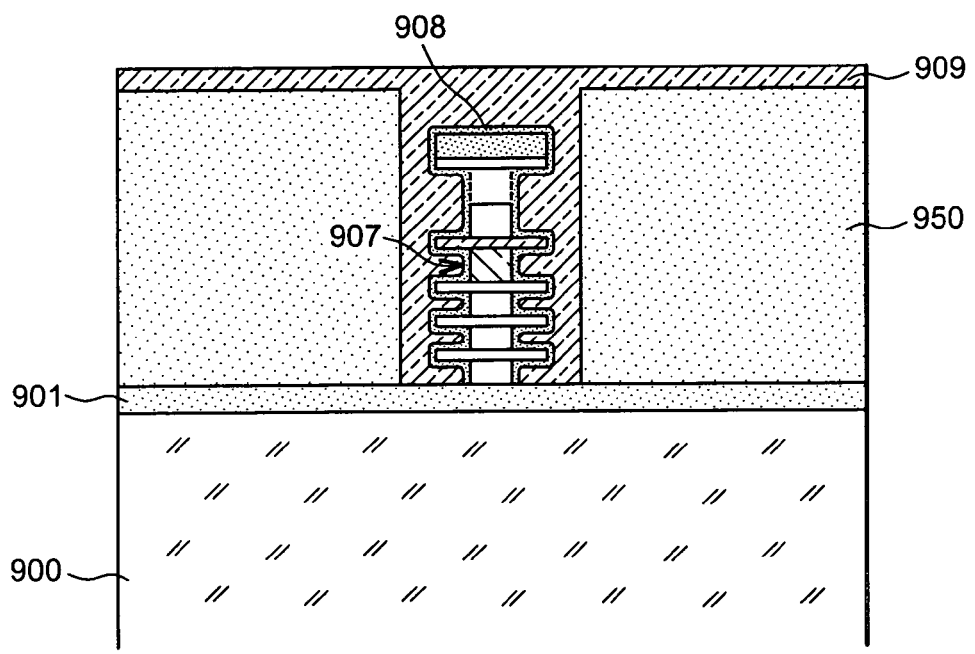
Figure 11C:
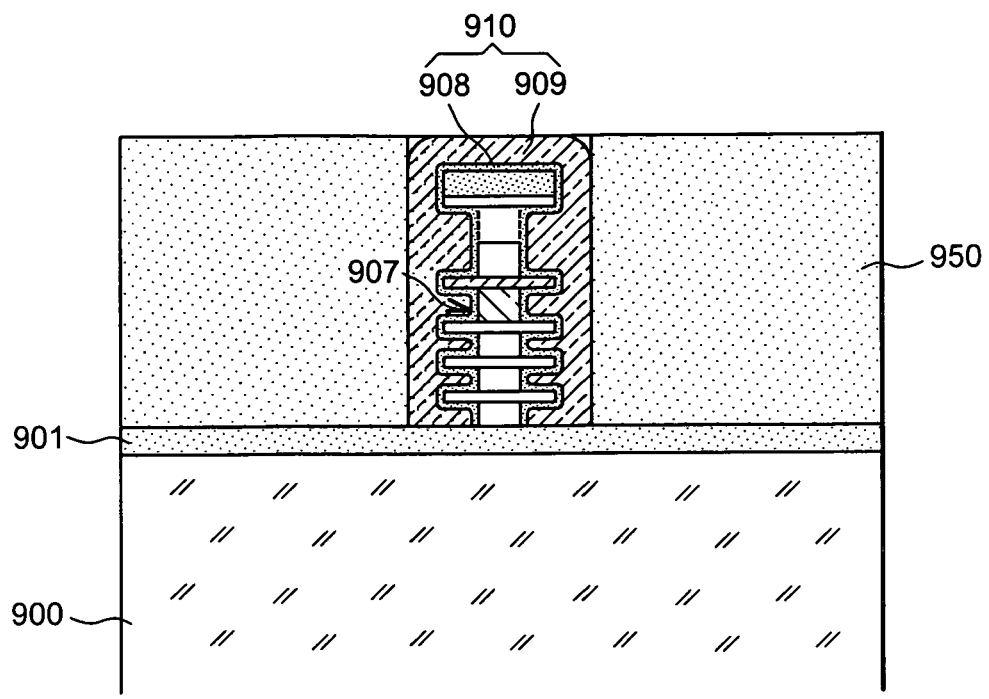

According to an alternative embodiment, the gate 910 can be produced using a damascene method on the basis of structure 902a. The formation of the gate 910 can be performed first by deposition of an insulating layer 950, for example, based on HTO (high temperature oxide). The insulating layer 950 can be produced with a thickness greater than the height of the structure 902a, so as to cover the latter. Next, an opening 960 is formed in the insulating layer 950, so as to expose the structure 902a. This opening 960 can be formed using conventional photolithography steps, followed by etching of the insulating layer 950. Next, a gate insulating layer 908, for example based on $SiO_2$, or $HfO_2$, is deposited, optionally conformally, on the structure 902a (FIG. 11A). The opening 960 is then filled with a gate material 909, for example, polysilicon or a metal (FIG. 11B). If the filling of the opening 960 runs over the mouth of the latter and covers the insulating layer 950, a CMP (chemical mechanical planarization) step can be performed so as to preserve the gate material 909 only in the opening 960, to the level of the mouth of the latter (FIG. 11C).

Figure 11D:
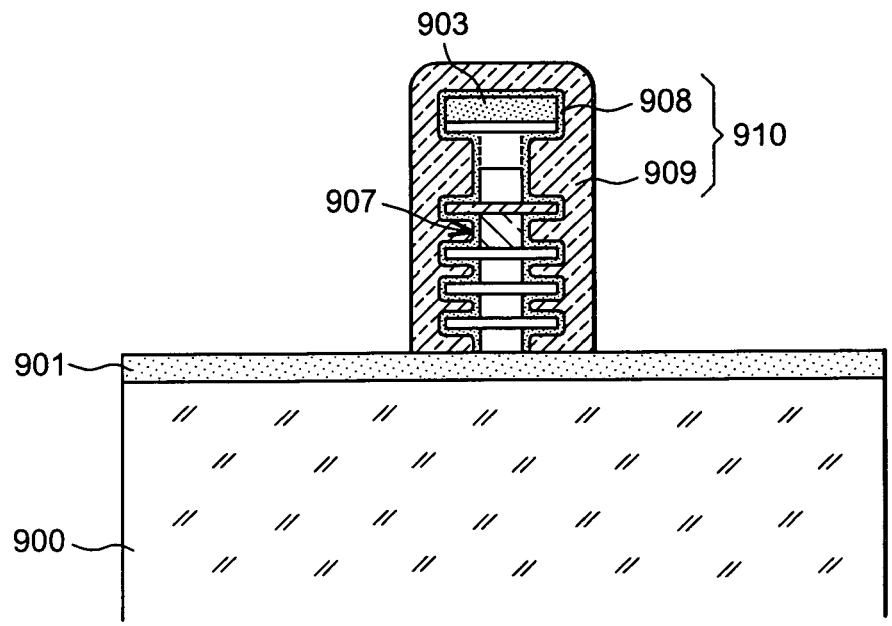

A step in which the insulating layer 950 is removed can then be performed (FIG. 11D).

CITED DOCUMENTS

[1]: U.S. Pat. No. 5,675,164, "High performance multi-mesa field effect transistor", October 1997, T. A. Brunner et al.

[2]: U.S. Pat. No. 6,413,802 B1, "Finfet transistor structures having a double gate channel extending vertically from a substrate and methods of manufacture", July 2002, Hu et al.

The invention claimed is:

1. Field-effect microelectronic device, including:
   a substrate; and
   at least one structure forming one or more channels capable of connecting, in the direction of their lengths, one or more sources and one or more drains, which structure is formed by a stack, in a direction orthogonal to a main plane of the substrate, of at least two bars having different widths thereby producing a notched side profile of the stack, said stack including an alternation of conducting bars and bars that based on an insulating material.

2. Microelectronic device according to claim 1, the stack including at least two successive bars of which one is based on Si and the other is based on $SiO_2$.

3. Microelectronic device according to claim 1, at least one of the bars being at least partially surrounded with insulating caps, in a direction parallel to a main plane of the substrate.

4. Microelectric device according to claim 1, said structure including at least two bars having different lengths and/or different thicknesses.

5. Field-effect microelectronic device according to claim 1, further comprising:
   a gate at least partially covering said structure and one or more sources connected by said structure to one or more drains.

6. Device according to claim 1, wherein the notched side profile is either a serrated profile or a crenellated profile.

* * * * *

UNITED STATES PATENT AND TRADEMARK OFFICE
CERTIFICATE OF CORRECTION

| | |
|---|---|
| PATENT NO. | : 7,518,195 B2 |
| APPLICATION NO. | : 10/576145 |
| DATED | : April 14, 2009 |
| INVENTOR(S) | : Thomas Ernst et al. |

It is certified that error appears in the above-identified patent and that said Letters Patent is hereby corrected as shown below:

Column 14, lines 2-3, change "conducting" to --seminconducting--.

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,518,195 B2 | Page 1 of 1 |
| APPLICATION NO. | : 10/576145 | |
| DATED | : April 14, 2009 | |
| INVENTOR(S) | : Thomas Ernst et al. | |

It is certified that error appears in the above-identified patent and that said Letters Patent is hereby corrected as shown below:

Column 14, lines 2-3, change "conducting" to --semiconducting--.

This certificate supersedes the Certificate of Correction issued December 14, 2010.

Signed and Sealed this
First Day of March, 2011

David J. Kappos
*Director of the United States Patent and Trademark Office*